United States Patent
Ishimaru et al.

(10) Patent No.: US 11,012,022 B2
(45) Date of Patent: May 18, 2021

(54) INVERTER DEVICE AND ELECTRIC MOTOR DEVICE USING SAME

(71) Applicant: Hitachi Power Semiconductor Device, Ltd., Hitachi (JP)

(72) Inventors: Tetsuya Ishimaru, Tokyo (JP); Junichi Sakano, Tokyo (JP); Shinichi Kurita, Ibaraki (JP)

(73) Assignee: Hitachi Power Semiconductor Device, Ltd., Hitachi (JP)

( * ) Notice: Subject to any disclaimer, the term of this patent is extended or adjusted under 35 U.S.C. 154(b) by 0 days.

(21) Appl. No.: 16/618,478

(22) PCT Filed: May 28, 2018

(86) PCT No.: PCT/JP2018/020262
§ 371 (c)(1),
(2) Date: Dec. 2, 2019

(87) PCT Pub. No.: WO2018/225548
PCT Pub. Date: Dec. 13, 2018

(65) Prior Publication Data
US 2020/0186076 A1   Jun. 11, 2020

(30) Foreign Application Priority Data

Jun. 8, 2017   (JP) .............................. JP2017-113832

(51) Int. Cl.
| H02P 27/08 | (2006.01) |
| H02M 1/08 | (2006.01) |
| H02M 7/5387 | (2007.01) |

(52) U.S. Cl.
CPC ............ *H02P 27/085* (2013.01); *H02M 1/08* (2013.01); *H02M 7/53871* (2013.01)

(58) Field of Classification Search
CPC .......... H02P 27/00; H02P 27/04; H02P 27/06; H02P 1/00; H02P 1/04; H02P 27/08;
(Continued)

(56) References Cited

U.S. PATENT DOCUMENTS

| 6,049,194 A * | 4/2000 | Nakagawa ............ H02J 7/1484 |
| | | 322/20 |
| 9,209,787 B2 * | 12/2015 | Shelton ................ H03K 17/063 |
| 2014/0111253 A1 * | 4/2014 | Fukuta ................ H03K 17/166 |
| | | 327/109 |

FOREIGN PATENT DOCUMENTS

| JP | 2004-350388 A | 12/2004 |
| JP | 2008-72848 A | 3/2008 |

(Continued)

OTHER PUBLICATIONS

International Search Report (PCT/ISA/210) issued in PCT Application No. PCT/JP2018/020262 dated Aug. 7, 2018 with English translation (four (4) pages).

(Continued)

*Primary Examiner* — Antony M Paul
(74) *Attorney, Agent, or Firm* — Crowell & Moring LLP

(57) ABSTRACT

The object of the invention is to provide an inverter device and an electric motor device using the same to shorten a dead time. Thus, an inverter device is provided, which includes: a switching element including a control terminal and a pair of main terminals; a control circuit configured to output a control signal which indicates whether to instruct an ON state of the switching element; a decision circuit configured to output a decision signal which indicates a state of the switching element based on a voltage between the main terminals of the switching element; and a drive circuit configured to control the ON state or an OFF state of the switching element based on the control signal and the decision signal.

14 Claims, 7 Drawing Sheets

(58) Field of Classification Search
CPC ...... H02P 1/08; H02P 1/10; H02P 1/12; H02P 1/16; H02P 1/163; H02P 1/18; H02P 1/24; H02P 1/26; H02P 1/42; H02P 1/46; H02P 1/465; H02P 3/00; H02P 6/00; H02P 21/00; H02P 4/00; H02P 5/00; H02P 23/00; H02P 25/00; H02P 27/085; H02M 1/08; H02M 7/5387
USPC ... 318/400.01, 700, 701, 727, 800, 801, 430
See application file for complete search history.

(56) References Cited

FOREIGN PATENT DOCUMENTS

| JP | 2011-36020 A | 2/2011 |
| JP | 2013-110908 A | 6/2013 |
| JP | 2016-127686 A | 7/2016 |
| JP | 2016-158478 A | 9/2016 |

OTHER PUBLICATIONS

Japanese-language Written Opinion (PCT/ISA/237) issued in PCT Application No. PCT/JP2018/020262 dated Aug. 7, 2018 (four (4) pages).

* cited by examiner

INVERTER DEVICE AND ELECTRIC MOTOR DEVICE USING SAME

TECHNICAL FIELD

The present invention relates to an inverter device and an electric motor device using the same.

BACKGROUND ART

An inverter device is a device converts a direct current (DC) into an alternating current (AC), and is widely used for driving motors of automobiles, railway vehicles, industrial equipment, and the like. In the inverter device, a semiconductor switching element is used, and the DC is converted into the AC by switching control over the semiconductor switching element. Examples of the semiconductor switching element include a Metal Oxide Semiconductor Field Effect Transistor (MOSFET) of Si or SiC and an Insulated Gate Bipolar Transistor (IGBT) of Si. The inverter device can not only convert the DC into the AC, but also convert the AC into the DC. That is, the AC of regenerative electric power of a motor can be converted into the DC and returned to a power supply side by synchronous rectification using the semiconductor switching element.

As an example of a three-phase inverter device using the MOSFET of SiC, abstract of PTL 1 below discloses that "In an inverter circuit (120), synchronous rectification is performed in which SiC-MOSFETs (130) are set into ON states at a predetermined timing when a reverse current flows to parasitic diodes (131) of the SiC-MOSFETs (130)."

PRIOR ART LITERATURE

Patent Literature

PTL 1: JP-A-2011-36020

SUMMARY OF INVENTION

Technical Problem

In a case where the inverter device performs ON or OFF control over the semiconductor switching elements in power running or regenerative running, when semiconductor switching elements on upper and lower arms are set into ON states at the same time, the upper and lower arms are short-circuited, and a through current flows in the upper and lower arms. In order to avoid this, it is common to provide a dead time during which the semiconductor switching elements on both the upper and lower arms are set in the OFF states. During the dead time period, a current that continues to flow to a coil of a motor is refluxed through the parasitic diodes built in the semiconductor switching elements or diodes connected in parallel to the semiconductor switching elements.

During the dead time period, a loss increases due to large forward voltage drops of the diodes when the reflux current flows to the diodes. Here, a forward voltage drop of a parasitic diode is about 0.7 V in the MOSFET of Si and reaches about 3.0 V in the MOSFET of SiC. Therefore, a loss in the MOSFET of SiC is particularly large. When the current flows to the parasitic diode in the MOSFET of SiC, a phenomenon called conduction deterioration may be generated in which characteristics of the parasitic diode deteriorate.

The invention has been made in view of the above circumstances, and an object of the invention is to provide an inverter device that can shorten a dead time and an electric motor device using the same.

Solution to Problem

In order to solve the above problems, an inverter device of the invention includes: a switching element including a control terminal and a pair of main terminals; a control circuit configured to output a control signal which indicates whether to instruct an ON state of the switching element; a decision circuit configured to output a decision signal which indicates a state of the switching element based on a voltage between the main terminals of the switching element; and a drive circuit configured to control the ON state and an OFF state of the switching element based on the control signal and the decision signal.

Advantageous Effect

According to the invention, the dead time can be shortened.

DESCRIPTION OF EMBODIMENTS

Configuration of Embodiment

<Overall Configuration>

Figure 1:
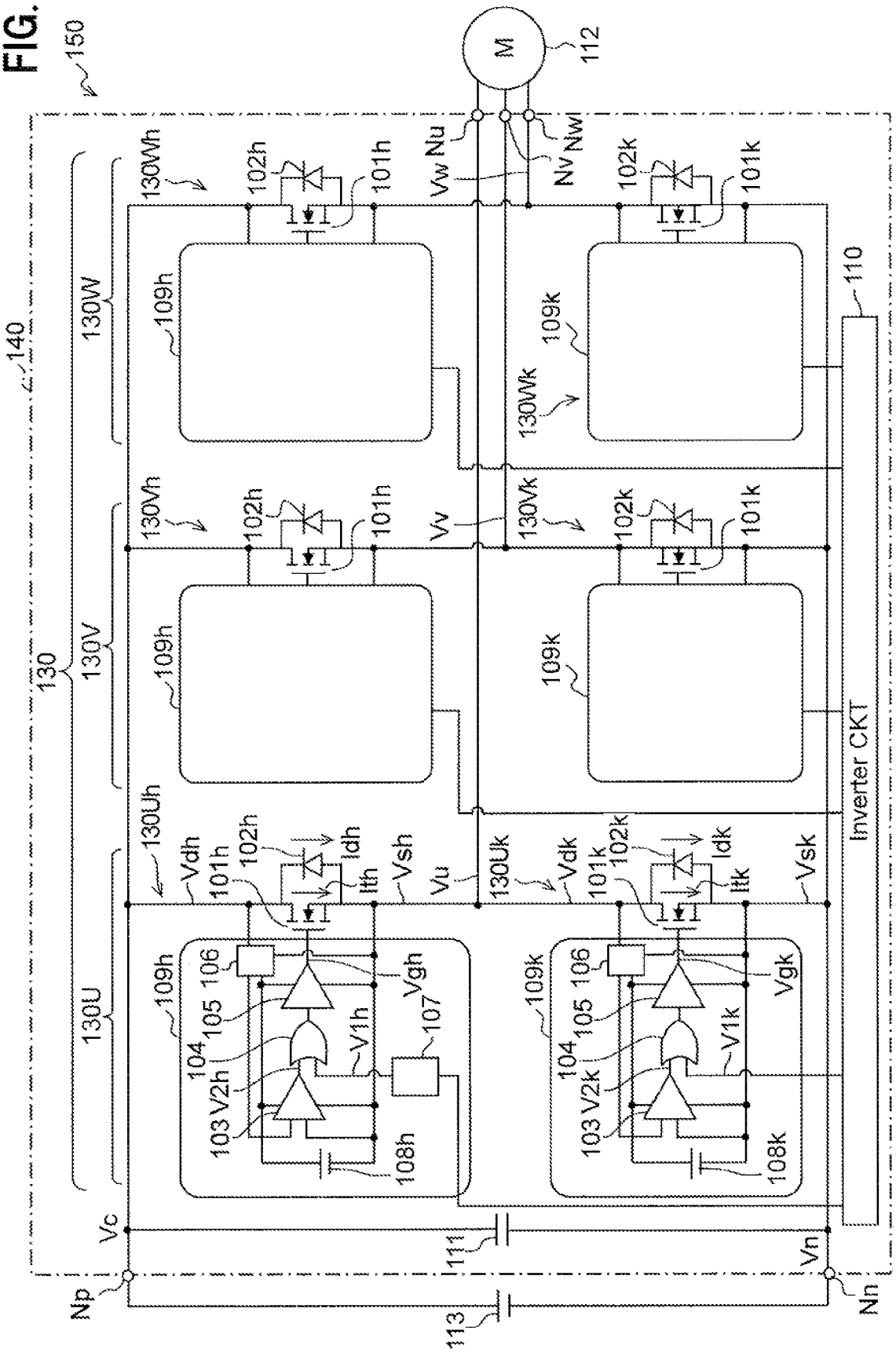
FIG. 1 is a block diagram of an electric motor device according to an embodiment of the invention.

An embodiment of the invention will be described in detail below with reference to accompanying drawings. Components having the same function are denoted by the same reference numerals in the drawings for describing embodiments, and repetitive description thereof will be omitted as appropriate. In the following description of the embodiments, the same or similar parts will not be repeatedly described unless otherwise required, and will be appropriately omitted.

FIG. 1 is a block diagram of an electric motor device 150 according to an embodiment of the invention.

As shown in FIG. 1, the electric motor device 150 includes a direct current power source 113, an inverter device 140, and a motor 112. The inverter device 140 includes an inverter circuit 130, an inverter control circuit 110, and a smoothing capacitor 111.

The inverter circuit 130 includes legs 130U, 130V, and 130W that are corresponding to U, V, and W phases, respectively. An upper arm 130Uh of the leg 130U is provided with one MOSFET 101h and an autonomous control circuit 109h that controls a switching state of the MOSFET 101h. Similarly, a lower arm 130Uk of the leg 130U is provided with one MOSFET 101k and an autonomous control circuit 109k that controls a switching state of the MOSFET 101k.

The leg 130V includes an upper arm 130Vh and a lower arm 130Vk. The leg 130W includes an upper arm 130Wh and a lower arm 130Wk. These have configurations similar to those in the upper arm 130Uh and the lower arm 130Uk of the U-phase. The legs 130U, 130V and 130W, and the smoothing capacitor 111 are connected in parallel to DC input terminals Np and Nn of the inverter device 140. The direct current power source 113 is connected to the DC input terminals Np and Nn. A voltage of the DC input terminal Np is referred to as a power supply voltage Vc, and a voltage of the DC input terminal Nn is referred to as a ground voltage Vn. The direct current power source 113 is, for example, an in-vehicle battery.

Connection points of the upper and lower arms of the respective legs 130U, 130V and 130W are connected to AC output terminals Nu, Nv, and Nw of the inverter device 140, respectively. The motor 112 is connected to the AC output terminals Nu, Nv and Nw. The motor 112 is, for example, an in-vehicle magnet three-phase synchronous electric motor. Voltages that appear at the AC output terminals Nu, Nv and Nw are referred to as a U-phase voltage Vu, a V-phase voltage Vv, and a W-phase voltage Vw.

Si or SiC can be applied to semiconductor materials of the MOSFETs 101h and 101k. The MOSFETs 101h and 101k include parasitic diodes 102h and 102k based on properties of the materials. However, instead of the MOSFETs 101h and 101k, an IGBT of Si or another semiconductor switching element may be applied. When a semiconductor switching element in which no parasitic diode is provided is applied, such as the IGBT of Si, a diode may be connected in parallel to the semiconductor switching element.

The inverter control circuit 110 performs inverter control such as Pulse Width Modulation (PWM) over each of the MOSFETs 101h and 101k via each of the autonomous control circuits 109h and 109k. A well-known general inverter control circuit can be applied as the inverter control circuit 110. However, the inverter control circuit 110 may not be specifically provided with a function for controlling synchronous rectification. This is because, as will be described in detail below, the inverter circuit 130 has a function of autonomously performing the synchronous rectification.

Here, a configuration of the autonomous control circuit 109k in the lower arm will be described. The autonomous control circuit 109k includes a decision circuit 103, an OR circuit 104, a gate driver 105, a voltage step-down/shutoff circuit (V) 106, and a direct current power source 108k. The decision circuit 103 compares a source voltage Vsk with a drain voltage Vdk of the MOSFET 101k in the lower arm, and outputs a comparison result as a voltage V2k. A general comparator or differential amplifier may be used as the decision circuit 103.

However, a difference between the drain voltage Vdk and the source voltage Vsk is relatively large and elements in the autonomous control circuit 109k have a relatively low withstand voltage. Therefore, it is preferable to divide a differential voltage Vdk−Vsk between the drain voltage Vdk and the source voltage Vsk and provide the divided differential voltage Vdk−Vsk to the decision circuit 103. Therefore, in the present embodiment, the voltage step-down/shutoff circuit 106 is inserted between a drain terminal of the MOSFET 101k and the decision circuit 103 to divide the differential voltage Vdk−Vsk. The inverter control circuit 110 supplies a voltage V1k that is a PWM modulated wave to the autonomous control circuit 109k. The OR circuit 104 outputs the voltages V1k and V2k as logical signals and outputs a logical sum of voltages V1k and V2k as a voltage signal. The gate driver 105 buffers the voltage signal supplied from the OR circuit 104 and applies a result as a gate voltage Vgk to a gate terminal of the MOSFET 101k.

Next, a configuration of the autonomous control circuit 109h in the upper arm will be described. The autonomous control circuit 109h includes the decision circuit 103, the OR circuit 104, the gate driver 105, and the voltage step-down/shutoff circuit 106, similarly to the autonomous control circuit 109k. The autonomous control circuit 109h includes a direct current power source 108h instead of the direct current power source 108k. The direct current power source 108h is floating with respect to the ground voltage Vn, and therefore a circuit that generates a power supply voltage by, for example, a bootstrap method or a charge pump method is applied.

In the autonomous control circuit 109h, a level shift circuit (L) 107 is provided between the inverter control circuit 110 and the OR circuit 104. The level shift circuit 107 shifts a level of a voltage V1h to be supplied to the OR circuit 104 in accordance with a level of a voltage signal supplied from the inverter control circuit 110. A reason why the level shift circuit 107 is provided is that the autonomous control circuit 109h is floating with respect to the ground voltage Vn.

With this configuration, in the autonomous control circuit 109h, the voltage step-down/shutoff circuit 106 divides a differential voltage Vdh−Vsh between a drain voltage Vdh and a source voltage Vsh of the MOSFET 101h and applies the divided differential voltage Vdh−Vsh to the decision circuit 103. The decision circuit 103 outputs a comparison result between the source voltage Vsh and the drain voltage Vdh as a voltage V2h. The OR circuit 104 outputs the voltage V1h that is a PWM modulated wave output from the level shift circuit 107 and the V2h as logical signals and outputs a logical sum of the voltages V1h and V2h as a voltage signal. The gate driver 105 amplifies the voltage signal supplied from the OR circuit 104, and applies a result as a gate voltage Vgh to a gate terminal of the MOSFET 101h.

<Decision Circuit 103>

Figure 2:
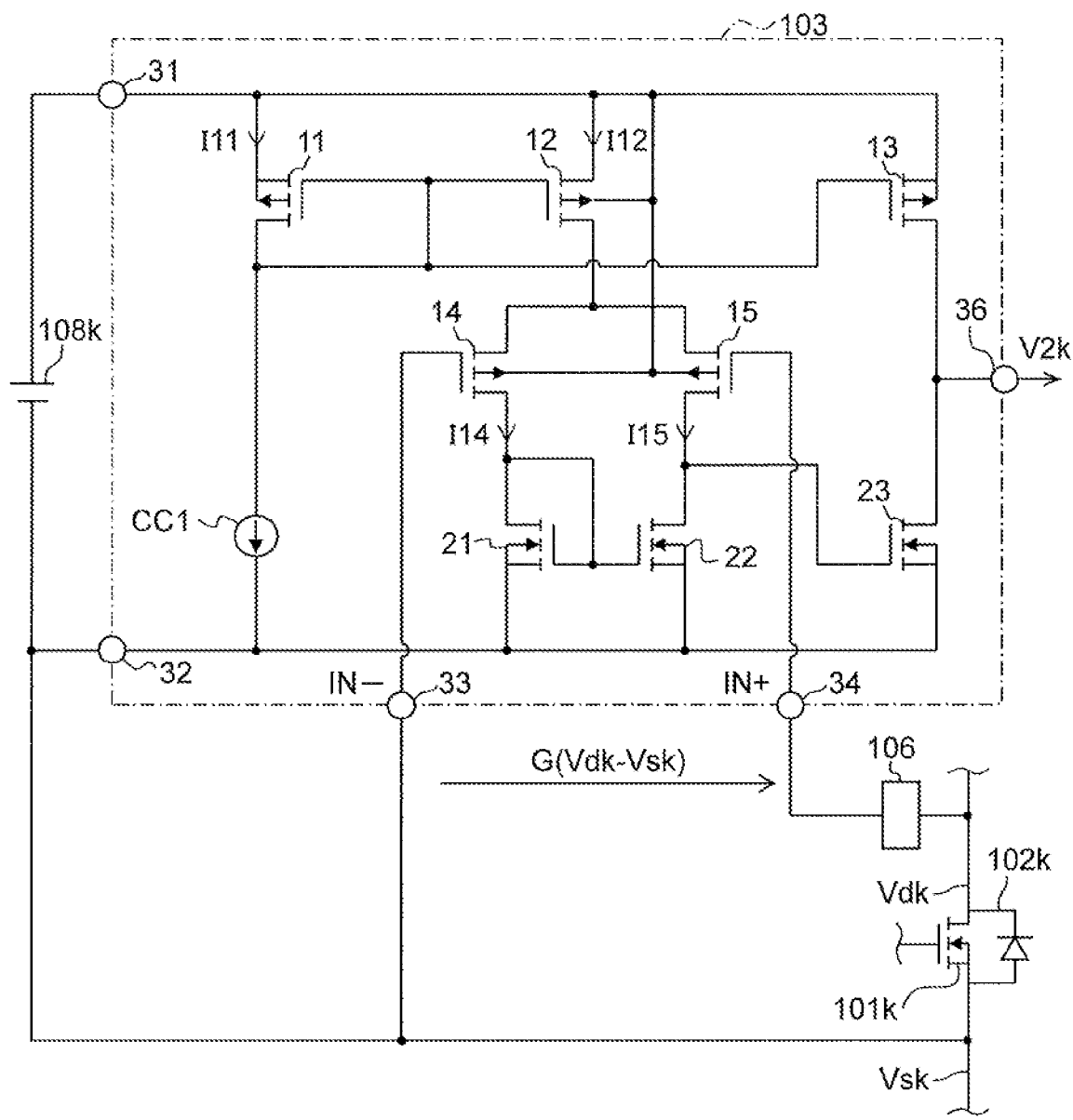
FIG. 2 is a circuit diagram of a decision circuit according to the embodiment.

FIG. 2 shows an example of a circuit diagram of the decision circuit 103 applied to the autonomous control circuits 109h and 109k. However, the following description is based on an example in which a reference numeral, a voltage, a current, and the like of each component are applied to the autonomous control circuit 109k in the lower arm.

The decision circuit 103 includes a constant current circuit CC1, P-channel MOSFETs (hereinafter referred to as PMOS) 11, 12, 13, 14, and 15, N-channel MOSFETs (hereinafter referred to as NMOS) 21, 22, and 23, power supply terminals 31 and 32, an inversion input terminal 33, a non-inversion input terminal 34, and an output terminal 36.

A positive electrode and a negative electrode of the direct current power source 108k are connected to the power supply terminals 31 and 32, respectively. The negative electrode of the direct current power source 108k is also connected to the non-inversion input terminal 34. The voltage step-down/shutoff circuit 106 applies a voltage G (Vdk−Vsk), which is acquired by dividing the differential voltage Vdk−Vsk between the drain voltage Vdk and the source voltage Vsk, between the inversion input terminal 33 and the non-inversion input terminal 34. Here, "G" is a constant.

The PMOSs 11, 12 and 13 constitute a mirror circuit. When a current I11 flows to the PMOS 11 by the constant current circuit CC1, currents I12 and I13 proportional to the current I11 flow to the PMOSs 12 and 13, respectively. Gate terminals of the PMOSs 14 and 15 are connected to the inversion input terminal 33 and the non-inversion input terminal 34, respectively. The current I12 is divided into currents I14 and I15 that respectively flow to the PMOSs 14 and 15. Here, depending on a value of the voltage G (Vdk−Vsk) applied to the inversion input terminal 33 and the non-inversion input terminal 34, a magnitude relationship between the current I14 and the current I15 is switched, and a high or low level of a voltage in the output terminal 36 is switched. The voltage in the output terminal 36 is the voltage V2k shown in FIG. 1.

Specifically, when "I14<I15", a gate voltage of the NMOS 23 is high, and the NMOS 23 is in an ON state, and therefore the voltage V2k is at a low level. On the other hand, when "I14>I15", the gate voltage of the NMOS 23 is low, and the NMOS 23 is in an OFF state, and therefore the voltage V2k is at a high level.

In order not to delay an OFF timing of the MOSFET 101k, an offset may be provided when the voltage V2k is switched. That is, when an offset voltage is set as Vt, the voltage V2k may be set to a low level when "Vsk−Vdk<Vt". During a period in which the voltage V1k (see FIG. 1) is at a low level, the MOSFET 101k can be set into an OFF state at a timing when the voltage V2k is at a low level. The offset voltage Vt may be decided based on a characteristic or the like of the MOSFET 101k, and may be, for example, set to about 50 mV.

When the offset voltage Vt is further increased, a larger current flows to the parasitic diode 102k, and a loss in the parasitic diode 102k increases. When the semiconductor material of the MOSFET 101k is SiC, conduction deterioration is likely to be generated in the MOSFET 101k.

Here, in order to prevent chattering (repeating the ON state and the OFF state within a short time) in the MOSFET 101k, it is considered to impart a hysteresis characteristic to the decision circuit 103. However, in the present embodiment, the hysteresis characteristic is not imparted to the decision circuit 103. This is because when the hysteresis characteristic is imparted, an ON timing of the MOSFET 101k is delayed.

For example, it is assumed that the hysteresis characteristic having a voltage width of 0.8 V is imparted to the decision circuit 103. In this case, the MOSFET 101k is kept in the OFF state until a voltage drop reaches 0.8 V due to a fact that a current flows to the parasitic diode 102k. During this period, a relatively large current flows to the parasitic diode 102k, and therefore a loss in the MOSFET 101k is increased or the conduction deterioration is generated. In the present embodiment, a configuration that prevents the chattering will be described below.

<Gate Driver 105>

Figure 3:
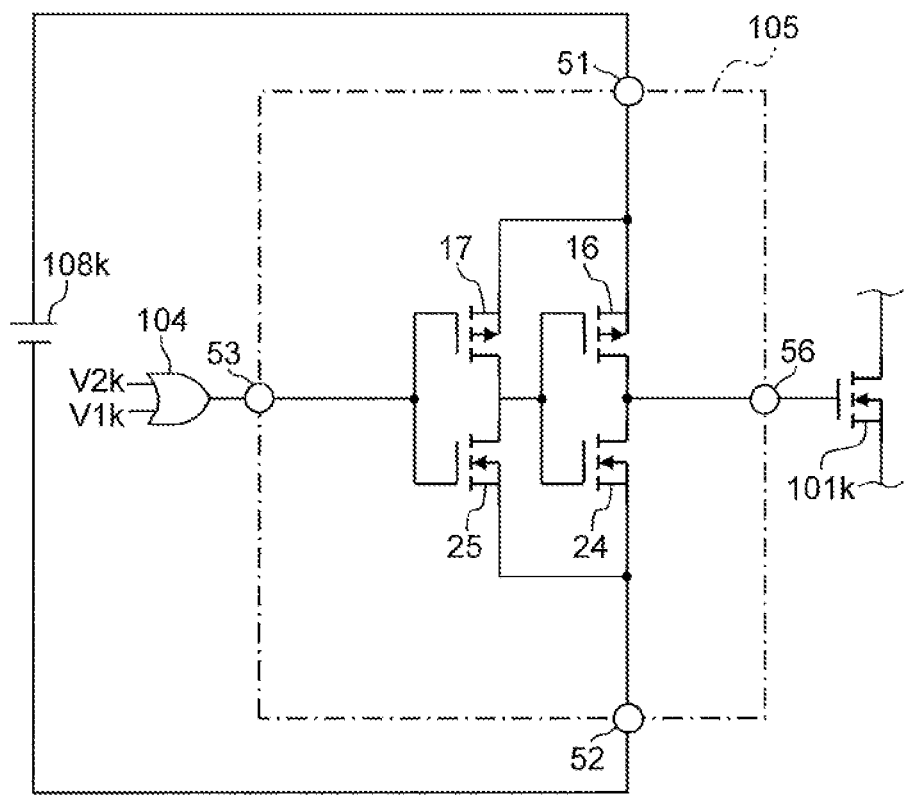
FIG. 3 is a circuit diagram of a gate driver according to the embodiment.

FIG. 3 shows an example of a circuit diagram of the gate driver 105 applied to the autonomous control circuits 109h and 109k. However, the following description is based on an example in which a reference numeral, a voltage, a current, and the like of each component are applied to the autonomous control circuit 109k in the lower arm.

In FIG. 3, the gate driver 105 includes PMOSs 16 and 17, NMOSs 24 and 25, power supply terminals 51 and 52, an input terminal 53, and an output terminal 56. The positive electrode and the negative electrode of the direct current power source 108k are connected to the power supply terminals 51 and 52, respectively. A voltage signal is supplied from the OR circuit 104 to the input terminal 53. The gate terminal of the MOSFET 101k is connected to the output terminal 56.

With this configuration, the gate driver 105 has a configuration including a two-stage CMOS buffer. That is, the gate driver 105 amplifies and buffers the voltage signal from the OR circuit 104, that is, a voltage signal corresponding to the logical sum of the voltages V1k and V2k, and applies a result to the gate terminal of the MOSFET 101k as the gate voltage Vgk.

As described above, the hysteresis characteristic is not imparted to the decision circuit 103 (see FIG. 2) of the present embodiment, but in a configuration in which the hysteresis characteristic is not simply imparted, the chattering may be generated in the MOSFET 101k. In the present embodiment, the chattering is prevented by making a rise time of the gate voltage Vgk longer than a fall time of the gate voltage Vgk in the gate driver 105.

In other words, the gate driver 105 drives the gate terminal of the MOSFET 101k such that a speed at which the MOSFET 101k is shifted from the ON state to the OFF state is faster than a speed at which the MOSFET 101k is shifted from the OFF state to the ON state. As a specific configuration therefor, for example, the PMOS 16 having a channel width narrower than that of the NMOS 24 may be applied.

Here, the rise time of the gate voltage Vgk corresponds to a time when the MOSFET 101k is shifted from the OFF state to the ON state, and the fall time corresponds to a time when the MOSFET 101k is shifted from the ON state to the OFF state. Therefore, the time when the MOSFET 101k is shifted from the OFF state to the ON state is longer than the time when the MOSFET 101k is shifted from the ON state to the OFF state. Accordingly, the chattering in the MOSFET 101k can be prevented by increasing the time when the MOSFET 101k is shifted from the OFF state to the ON state. The number of stages of the CMOS buffer in the gate driver 105 may not be two, and an optimum number of stages may be selected based on a gate capacitance or the like of the MOSFET 101k.

<Voltage Step-Down/Shutoff Circuit 106>

Figure 4:
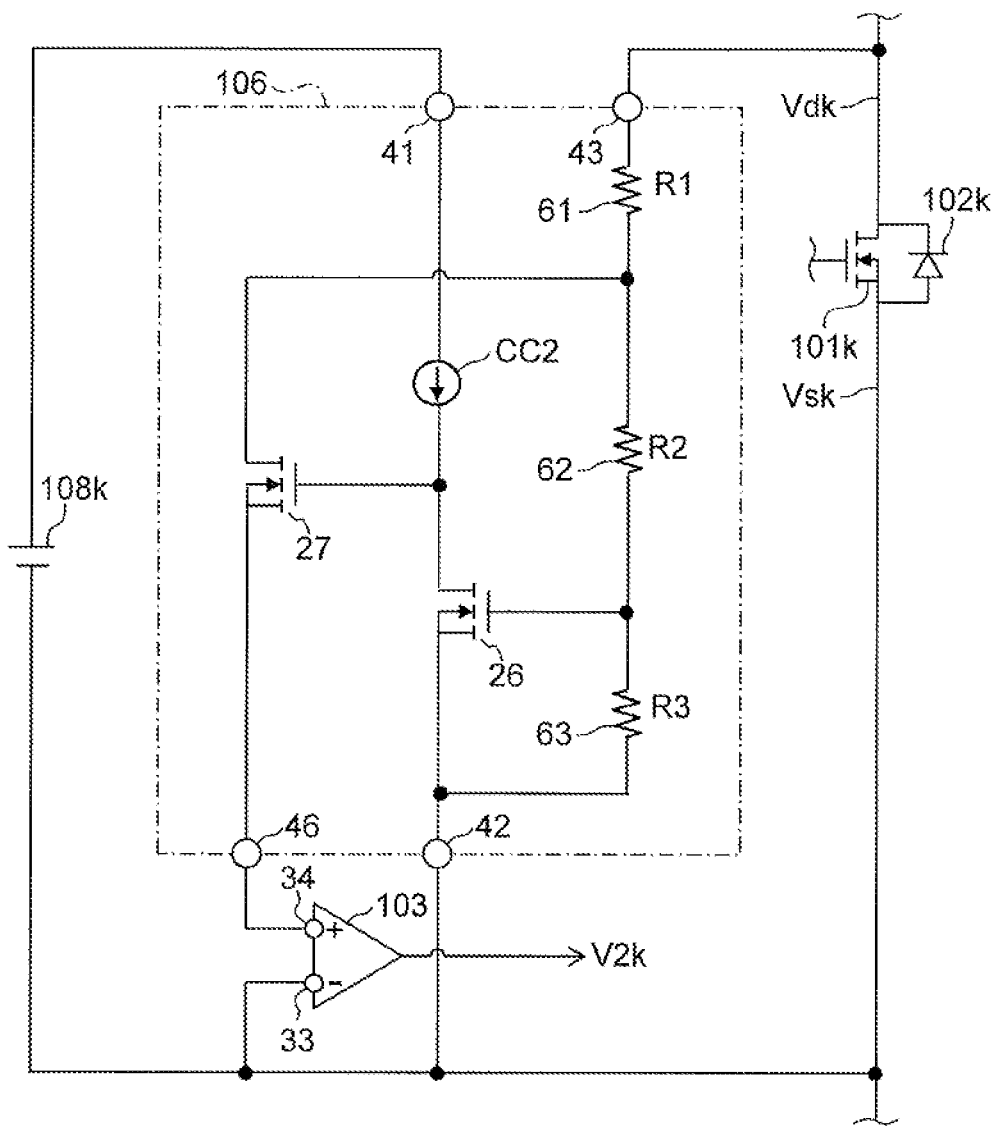
FIG. 4 is a circuit diagram of a voltage step-down/shutoff circuit according to the embodiment.

FIG. 4 shows an example of a circuit diagram of the voltage step-down/shutoff circuit 106 applied to the autonomous control circuits 109h and 109k. However, the following description is based on an example in which a reference numeral, a voltage, a current, and the like of each component are applied to the autonomous control circuit 109k in the lower arm.

In FIG. 4, the voltage step-down/shutoff circuit 106 includes resistors 61, 62 and 63, NMOSs 26 and 27, a constant current circuit CC2, power supply terminals 41 and 42, an input terminal 43, and an output terminal 46. Here, resistance values of the resistors 61, 62, and 63 are set as R1, R2, and R3. The positive electrode and the negative electrode of the direct current power source 108k are connected to the power supply terminals 41 and 42, respectively. The input terminal 43 of the voltage step-down/shutoff circuit 106 is connected to the drain terminal of the MOSFET 101k, and the output terminal 46 thereof is connected to the non-inversion input terminal 34 of the decision circuit 103.

In FIG. 1, when the current is refluxed from the motor 112 to the direct current power source 113, the drain voltage Vdk is lower than the source voltage Vsk in the MOSFET 101*k* in the lower arm 130Uk. At this time, in FIG. 4, a voltage of the input terminal 43 is equal to the drain voltage Vdk, and a voltage of the power supply terminal 42 is equal to the source voltage Vsk. Therefore, a gate-source voltage of the NMOS 26 is a negative value, and the NMOS 26 is in an OFF state.

Accordingly, a voltage of a gate terminal of the NMOS 27 is substantially the same as a voltage of the positive electrode of the direct current power source 108*k*, and the NMOS 27 is in an ON state. Then, the voltage G (Vdk−Vsk), which is a positive voltage, is applied between the non-inversion input terminal 34 and the inversion input terminal 33 of the decision circuit 103. As described above, "G" is a constant, and more specifically, the constant G is a voltage division ratio decided by the resistors 61, 62, and 63, that is, "(R2+R3)/(R1+R2+R3)".

When the voltage G (Vdk−Vsk), which is the positive voltage, is applied between the non-inversion input terminal 34 and the inversion input terminal 33 of the decision circuit 103, an output voltage of the decision circuit 103, that is, the voltage V2*k* is at a high level, and an output voltage of the OR circuit 104 (see FIG. 1) is also at a high level. Therefore, the gate driver 105 allows the MOSFET 101*k* to be in the ON state. Accordingly, a reflux current flows through the MOSFET 101*k* instead of the parasitic diode 102*k*. Since a voltage drop of the MOSFET 101*k* in the ON state is lower than a voltage drop of the parasitic diode 102*k*, the loss can be reduced.

In FIG. 1, during a period in which electric power is supplied from the direct current power source 113 to the motor 112 via the MOSFET 101*k* in the lower arm 130Uk, the drain voltage Vdk is higher than the source voltage Vsk in the MOSFET 101*k*. At this time, in FIG. 4, the gate-source voltage of the NMOS 26 is a positive value, and the NMOS 26 is in an ON state. Accordingly, the voltage of the gate terminal of the NMOS 27 is substantially the same as a voltage of the negative electrode of the direct current power source 108*k*, and the NMOS 27 is in an OFF state. Accordingly, the voltage G (Vdk−Vsk) is not applied to the non-inversion input terminal 34 of the decision circuit 103, and the voltage V2*k* in a low level is output from the decision circuit 103. As a result, the ON or OFF state of the MOSFET 101*k* is decided by the voltage V1*k* applied from the inverter control circuit 110 (see FIG. 1).

According to the configuration of the voltage step-down/shutoff circuit 106 described above, since the differential voltage Vdk−Vsk is divided by the resistors 61, 62 and 63, a high voltage can be prevented from being applied to a gate terminal of the NMOS 26 and a drain terminal of the NMOS 27. Therefore, even when the differential voltage Vdk−Vsk is high, the decision circuit 103 can be prevented from being destroyed by the high voltage.

The configurations of the decision circuit 103, the gate driver 105, and the voltage step-down/shutoff circuit 106 in the lower arm 130Uk have been described above, and these components in the upper arm 130Uh are similar to those in the lower arm 130Uk.

Here, in the inverter circuit 130 shown in FIG. 1, a sensor (not shown) for a voltage or a current is provided at each component, and detection results of these sensors are supplied to the inverter control circuit 110. The inverter control circuit 110 decides whether the inverter circuit 130 is in a state of "power running" or "regenerative running" based on these detection results. Here, the "power running" refers to a state where the electric power is supplied from the direct current power source 113 to the motor 112. The "regenerative running" refers to a state where the electric power is regenerated from the motor 112 to the direct current power source 113, and the inverter circuit 130 performs an operation of rectifying an AC voltage output from the motor 112.

During the regenerative running, the inverter control circuit 110 stops control over the voltages V1*h* and V1*k*. That is, the voltages V1*h* and V1*k* are maintained at a low level and are not involved in control over the MOSFETs 101*h* and 101*k*. Therefore, the ON or OFF state of the MOSFETs 101*h* and 101*k* is controlled only by the voltages V2*h* and V2*k* output from the decision circuits 103 of respective components.

<Configuration of Comparative Example>

In order to clarify an effect of the present embodiment, a configuration of a comparative example will be described. Illustration of the comparative example is omitted. However, a point different from the present embodiment is that the decision circuits 103, the OR circuits 104, and the voltage step-down/shutoff circuits 106 are not provided in the autonomous control circuits 109*h* and 109*k* in FIG. 1. That is, in the upper arm 130Uh, the voltage V1*h* output from the inverter control circuit 110 via the level shift circuit 107 is directly input to the gate driver 105 of the autonomous control circuit 109*h*. In the lower arm 130Uk, the voltage V1*k* output from the inverter control circuit 110 is directly input to the gate driver 105 of the autonomous control circuit 109*k*.

In the present comparative example, the inverter control circuit 110 is different from that of the above embodiment in that the control over the voltages V1*h* and V1*k* is continued even during the regenerative running. That is, the inverter control circuit 110 allows the inverter circuit 130 to perform synchronous rectification based on the voltages V1*h* and V1*k*.

Operation of Embodiment (Operation During Power Running)

Next, the operation of the present embodiment during the power running will be described. In the description, the operation of the comparative example will also be appropriately described.

FIGS. 5A to 5K show waveform diagrams of voltages or currents of respective components in the leg 130U during the power running. In these diagrams, a thick solid line represents a waveform according to the present embodiment, and a thick broken line represents a waveform according to the comparative example. Waveforms of the legs 130V and 130W are the same as a waveform of the leg 130U except for a difference in phases, illustration thereof will be omitted.

Figure 5:
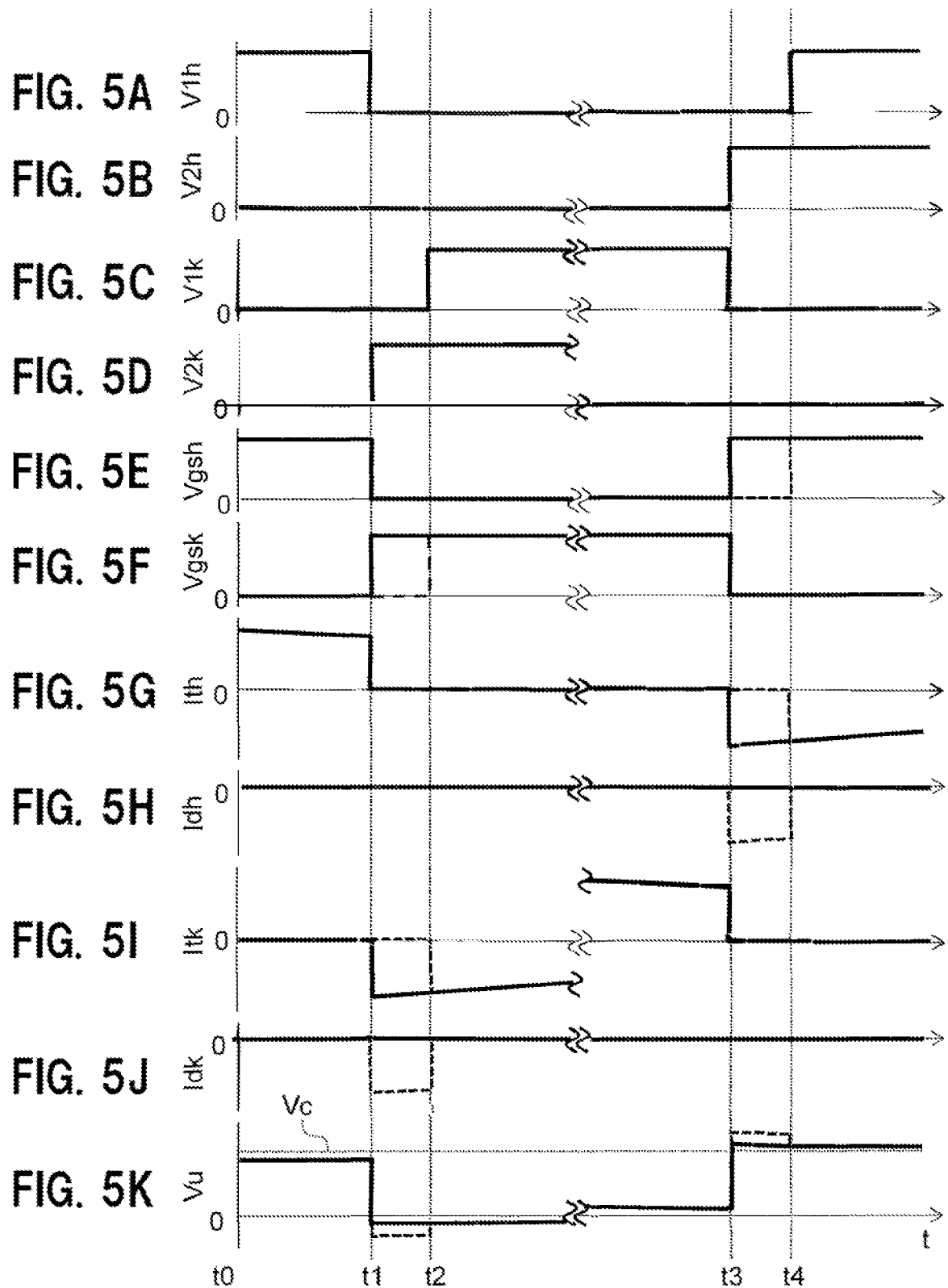
FIGS. 5A to 5K show waveform diagrams of a voltage V1$h$, a voltage V2$h$, a voltage V1$k$, a voltage V2$k$, a gate-source voltage Vgsh, a gate-source voltage Vgsk, a drain current Ith, a source current Idh, a drain current Itk, a cathode current Idk, and a U-phase voltage Vu, respectively, during power running.

Waveform diagrams of V1*h* and V2*h* in FIGS. 5A and 5B are waveform diagrams of the voltages V1*h* and V2*h* in the autonomous control circuit 109*h* in the upper arm 130Uh, respectively. In all of these waveform diagrams, the source voltage Vsh of the MOSFET 101*h* in the upper arm 130Uh is shown as a reference level (0 V). Waveform diagrams of V1*k* and V2*k* in FIGS. 5C and 5D are waveform diagrams of the voltages V1*k* and V2*k* in the autonomous control circuit 109*k* in the lower arm 130Uk, respectively. All of these waveform diagrams show the source voltage Vsk of the MOSFET 101*k* in the lower arm 130Uk as a reference level (0 V).

Waveform diagrams of Vgsh and Vgsk in FIGS. 5E and 5F are waveform diagrams of gate-source voltages Vgsh and Vgsk of the MOSFETs 101h and 101k in the upper and lower arms 130Uh and 130Uk, respectively. Waveform diagrams of Ith and Idh in FIGS. 5G and 5H are waveform diagrams of a drain current Ith of the MOSFET 101h and a cathode current Idh of the parasitic diode 102h in the upper arm 130Uh, respectively.

Waveform diagrams of Itk and Idk in FIGS. 5I and 5J are waveform diagrams of a drain current Itk of the MOSFET 101k and a cathode current Idk of the parasitic diode 102k in the lower arm 130Uk, respectively. Here, the drain currents Ith and Itk are currents that flow to the MOSFET when the MOSFETs 101h and 101k are in an ON state, and the cathode currents Idh and Idk are currents that flow to the MOSFET when the MOSFET is in an OFF state. Here, it is assumed that polarities of the drain currents Ith and Itk and polarities of the cathode currents Idh and Idk are positive values in a downward direction as indicated by arrows shown in FIG. 1. A waveform diagram of Vu in FIG. 5K is a waveform diagram of the U-phase voltage Vu that appears at the AC output terminal Nu. Here, the reference level (0 V) of the U-phase voltage Vu is a negative electrode of the direct current power source 113.

In FIG. 1, when the power running is performed, the inverter control circuit 110 performs switching control over the MOSFETs 101h and 101k at a desired timing. Accordingly, a voltage near the power supply voltage Vc at the DC input terminal Np of the direct current power source 113 and a voltage near the ground voltage Vn (0 V) at the DC input terminal Nn alternately appear at the AC output terminals Nu, Nv and Nw.

Here, a period during which the inverter control circuit 110 sets the MOSFET 101h in the upper arm 130Uh in the ON state, that is, a period during which the voltage V1h is set to a high level is referred to as an "upper arm compulsive conduction period". Further, a period during which the inverter control circuit 110 sets the MOSFET 101k in the lower arm 130Uk in the OFF state, that is, a period during which the voltage V1k is set to a high level is referred to as a "lower arm compulsive conduction period".

During the power running, the above-described upper arm compulsive conduction period and lower arm compulsive conduction period are alternately repeated. Between the upper arm compulsive conduction period and the lower arm compulsive conduction period, a period is set during which both the voltages V1h and V1k are at a low level. This period is referred to as an "external control pause period". Even during the external control pause period, when any one of the voltages V2h and V2k is at a high level, the corresponding MOSFET 101h or MOSFET 101k is in the ON state. A period during which both the voltages V2h and V2k are at a low level within the external control pause period is a "dead time".

During the dead time, both the MOSFETs 101h and 101k in the upper and lower arms 130Uh and 130Uk are in the OFF state. When the MOSFETs 101h and 101k are in the ON state at the same time, a through current may flow through the MOSFETs 101h and 101k, and the MOSFETs 101h and 101k may be damaged. Therefore, the dead time is provided to avoid this.

In FIGS. 5A to 5K, a period from a time point t0 to a time point t1 and a period starting from a time point t4 are the above-described "upper arm compulsive conduction periods". A period from a time point t2 to a time point t3 is the "lower arm compulsive conduction period". A period from the time point t1 to the time point t2 and a period from the time point t3 to the time point t4 are the "external control pause periods".

(Time Point t0 to Time Point t1)

Hereinafter, an operation during each period will be described in more detail. First, the upper arm compulsive conduction period from the time point t0 to the time point t1 will be examined.

As shown in the waveform diagram of V1h in FIG. 5A, the inverter control circuit 110 sets the voltage V1h in the autonomous control circuit 109h (see FIG. 1) in the upper arm to a high level during the upper arm compulsive conduction period (t0 to t1). Therefore, in the upper arm, the gate driver 105 outputs a high-level voltage via the OR circuit 104. Accordingly, as shown in the waveform diagram of Vgsh in FIG. 5E, the gate-source voltage Vgsh of the MOSFET 101h is at a high level, and the MOSFET 101h is in the ON state.

On the other hand, as shown in the waveform diagram of V1k in FIG. 5C, the inverter control circuit 110 sets the voltage V1k in the autonomous control circuit 109k (see FIG. 1) in the lower arm to a low level during the upper arm compulsive conduction period (t0 to t1). During the same period, the voltage V2k is also kept at a low level as shown in the waveform diagram of V2k in FIG. 5D. Therefore, in the lower arm, the gate driver 105 outputs a low-level voltage via the OR circuit 104. Accordingly, as shown in the waveform diagram of Vgsk in FIG. 5F, the gate-source voltage Vgsk of the MOSFET 101k is at a low level, and the MOSFET 101k is in the OFF state.

When the MOSFET 101h in the upper arm is in the ON state, the drain current Ith flows thereto, as shown in the waveform diagram of Ith in FIG. 5G. A direction of the drain current Ith is decided by a direction where the current flows to a coil of the motor 112. In the example of FIG. 5G, since the drain current Ith is a positive value during the period from the time point t0 to the time point t1, the drain current Ith flows in a direction indicated by the arrow shown in FIG. 1, that is, from the source terminal to the drain terminal of the MOSFET 101h. On the other hand, since the MOSFET 101k in the lower arm is in the OFF state during the period from the time point t0 to the time point t1, the drain current Itk is a zero value during the period from the time point t0 to the time point t1 as shown in the waveform diagram of Itk in FIG. 5I.

As described above, in the upper arm 130Uh, since the current flows from the drain terminal to the source terminal of the MOSFET 101h, a voltage drop is generated in the MOSFET 101h. Therefore, as shown in the waveform diagram of Vu in FIG. 5K, the U-phase voltage Vu that appears at the AC output terminal Nu is at a level slightly lower than the power supply voltage Vc during the period from the time point t0 to time point t1.

During the period from the time point t0 to the time point t1, in both the upper arm and the lower arm, the drain voltages Vdh and Vdk of the MOSFETs 101h and 101k are higher than the corresponding source voltages Vsh and Vsk. Therefore, as shown in the waveform diagrams of V2h and V2k in FIGS. 5B and 5D, the voltages V2h and V2k output from the decision circuit 103 are both at a low level and are not involved in output of the OR circuit 104 or output of the gate driver 105. A voltage in a reverse direction is applied to the parasitic diodes 102h and 102k during the period from the time point t0 to the time point t1, and therefore the cathode currents Idh and Idk of the parasitic diodes 102h and 102k are zero values as shown in the waveform diagrams of Idh and Idk in FIGS. 5H and 5J. The operation during the upper arm compulsive conduction period from time point t0 to the time point t1 in the present embodiment has been described above, and the operation during this period is also the same for the comparative example.

(Time Point t1 to Time Point t2)

Next, an operation during the external control pause period from the time point t1 to the time point t2 will be described in detail.

First, as shown in the waveform diagram of V1h in FIG. 5A, at the time point t1, the voltage V1h from the inverter control circuit 110 to the upper arm falls from a high level to a low level. Since the voltage V2h remains at a low level before the time point t1, an output voltage of the OR circuit 104 and an output voltage of the gate driver 105 also fall to a low level at the time point t1. Accordingly, as shown in the waveform diagram of Vgsh in FIG. 5E, at the time point t1, the gate-source voltage Vgsh of the MOSFET 101h in the upper arm also falls to a low level, and the MOSFET 101h is in the OFF state.

When the MOSFET 101h is in the OFF state, as shown in the waveform diagram of Ith in FIG. 5G, the drain current Ith of the MOSFET 101h is a zero value at the time point t1. However, since a current having a non-zero value flows from the MOSFET 101h to the coil of the motor 112 before the time point t1, when the MOSFET 101h is in the OFF state, a counter electromotive force is generated in the coil, and the coil continues to keep the current flow.

Here, an operation of the comparative example will be examined.

In an inverter device of the comparative example, as indicated by the thick broken line in the waveform diagram of Idk in FIG. 5J, a reflux current flows from the parasitic diode 102k in the lower arm to the coil of the motor as the cathode current Idk during the period from the time point t1 to the time point t2. That is, in the comparative example, the "external control pause period" is directly equal to the "dead time".

At this time, as indicated by the thick broken line in the waveform diagram of Vgsk in FIG. 5F, the gate-source voltage Vgsk of the MOSFET 101k in the lower arm remains a zero value during the period from the time point t1 to the time point t2. Therefore, as shown in the waveform diagram of Itk in FIG. 5I, the drain current Itk remains a zero value during the period from the time point t1 to the time point t2. As indicated by the thick broken line in the waveform diagram of Vu in FIG. 5K, the U-phase voltage Vu of the AC output terminal Nu is lower than the ground voltage Vn (0 V) of the DC input terminal Nn by an amount corresponding to the voltage drop of the parasitic diode 102k during the period from the time point t1 to the time point t2.

On the other hand, in the present embodiment, when the parasitic diode 102k in the lower arm attempts to allow the reflux current to flow at the time point t1, the drain voltage Vdk of the MOSFET 101k is lower than the source voltage Vsk. Accordingly, as shown in the waveform diagram of V2k in FIG. 5D, the voltage V2k rises from a low level to a high level at the time point t1. Accordingly, an output voltage of the gate driver 105 is also at a high level via the OR circuit 104 in the lower arm. Accordingly, as shown in the waveform diagram of Vgsk in FIG. 5F, the gate-source voltage Vgsk of the MOSFET 101k rises to a high level, and the MOSFET 101k is in an ON state.

Then, as indicated by the thick solid line in the waveform diagram of Itk in FIG. 5I, after the time point t1, the reflux current flows to the MOSFET 101k instead of the parasitic diode 102k as the drain current Itk. As indicated by the thick solid line in the waveform diagram of Vu in FIG. 5K, the U-phase voltage Vu output from the AC output terminal Nu is lower than the ground voltage Vn (0 V) of the DC input terminal Nn by an amount corresponding to a voltage drop of the MOSFET 101k. Since the voltage drop when the MOSFET 101k is in the ON state is smaller than the voltage drop of the parasitic diode 102k, the U-phase voltage Vu can be set to a level close to the power supply voltage Vc as compared with the comparative example (thick broken line).

(Time Point t2 to Time Point t3)

Next, an operation during the lower arm compulsive conduction period from the time point t2 to the time point t3 will be described in detail.

As shown in the waveform diagram of V1h in FIG. 5A, the voltage V1h in the upper arm continues to be at a low level since before the time point t2. Therefore, as shown in the waveform diagram of Vgsh in FIG. 5E, the gate-source voltage Vgsh of the MOSFET 101h also remains at a low level at the time point t2, and the MOSFET 101h remains in the OFF state. On the other hand, as shown in the waveform diagram of V1k in FIG. 5C, the voltage V1k in the lower arm rises to a high level at the time point t2. However, as shown in the waveform diagram of V2k in FIG. 5D, the voltage V2k is at a high level since before the time point t2, and therefore the MOSFET 101k remains in the ON state.

Here, the comparative example will be examined again.

In the inverter device of the comparative example, when the voltage V1k (see the waveform diagram of V1k in FIG. 5C) rises at the time point t2, the gate-source voltage Vgsk rises to a high level at the time point t2, as indicated by the thick broken line in the waveform diagram of Vgsk in FIG. 5K. Then, as indicated by thick broken lines in the waveform diagrams of Itk and Idk in FIGS. 5I and 5J, the reflux current, which flows to the parasitic diode 102k before the time point t2 as the cathode current Idk, flows to the MOSFET 101k after the time point t2 as the drain current Itk.

In the present embodiment, as indicated by the thick solid line in the waveform diagram of Vgsk in FIG. 5F, the gate-source voltage Vgsk of the MOSFET 101k continues to be at a high level since before the time point t2. Therefore, as indicated by the thick solid line in the waveform diagram of Itk in FIG. 5I, the drain current Itk having a non-zero value continues to flow to the MOSFET 101k since before the time point t2. As described above, a direction where a current flows to the MOSFET 101k in the lower arm is decided by a direction where the current flows to the coil of the motor 112. Immediately after a start of the lower arm compulsive conduction period (t2 to t3), a polarity of the drain current Itk is negative. That is, in FIG. 1, the current flows from the source terminal to the drain terminal of the MOSFET 101k.

On the other hand, the polarity of the drain current Itk is switched during the lower arm compulsive conduction period (t2 to t3), and the current flows from the drain terminal to the source terminal of the MOSFET 101k. This state continues until an end of the lower arm compulsive conduction period (t2 to t3). When the polarity of the drain current Itk is switched, the drain voltage Vdk is higher than the source voltage Vsk in the MOSFET 101. Therefore, as shown in the waveform diagram of V2k in FIG. 5D, the voltage V2k of an output signal of the decision circuit 103 in the lower arm falls to a low level before the time point t3, and the voltage V2k is not involved in the output of the gate driver 105.

(Time Point t3 to Time Point t4)

Next, an operation during the external control pause period from the time point t3 to the time point t4 will be described in detail.

As shown in the waveform diagram of V1k in FIG. 5C, the voltage V1k in the lower arm falls to a low level at the time point t3. Therefore, the output voltage of the gate driver 105 is also at a low level via the OR circuit 104 in the lower arm. Accordingly, as shown in the waveform diagram of Vgsk in FIG. 5F, the gate-source voltage Vgsk of the MOSFET 101k also falls to a low level, and the MOSFET 101k is in the OFF state.

Accordingly, as shown in the waveform diagram of Itk in FIG. 5I, the drain current Itk of the MOSFET 101k is a zero value after the time point t3. The subsequent operation during the external control pause period (t3 to t4) is the same as the previous operation during the external control pause period (t1 to t2), except that the operations of the upper and lower arms 130Uh and 130Uk are reversed.

In the inverter device of the comparative example, as indicated by the thick broken line in the waveform diagram of Idh in FIG. 5H, the reflux current becomes the cathode current Idh and flows to the parasitic diode 102h during the period from the time point t3 to the time point t4. As indicated by the thick broken line in the waveform diagram of Vu in FIG. 5K, the U-phase voltage Vu that appears at the AC output terminal Nu is higher than the power supply voltage Vc by an amount corresponding to the voltage drop of the parasitic diode 102h during the period from the time point t3 to the time point t4.

In contrast, in the present embodiment, when the voltage V2h (see the waveform diagram of V2h in FIG. 5B) rises from a low level to a high level at the time point t3, the gate-source voltage Vgsh of the MOSFET 101h rises to a high level (see the thick solid line in the waveform diagram of Vgsh in FIG. 5E), and the MOSFET 101h is in the ON state. Accordingly, as indicated by the thick solid line in the waveform diagram of Ith in FIG. 5G, the reflux current flows to the MOSFET 101h instead of the parasitic diode 102h as the drain current Ith. Since a voltage drop when the MOSFET 101h is in the ON state is smaller than the voltage drop of the parasitic diode 102h, the U-phase voltage Vu, as compared with the comparative example (thick broken line), can be set to a level close to the power supply voltage Vc, as indicated by the thick solid line in the waveform diagram of Vu in FIG. 5K.

(After Time Point t4)

At the time point t4, the upper arm compulsive conduction period is started again. The operation during this period is the same as that during the lower arm compulsive conduction period (t2 to t3), except that the operations of the upper and lower arms 130Uh and 130Uk are reversed. That is, in the comparative example, as indicated by the thick broken line in the waveform diagram of Vgsh in FIG. 5E, the gate-source voltage Vgsh rises to a high level at the time point t4, and the MOSFET 101h is in the ON state. As indicated by thick broken lines in the waveform diagrams of Ith and Idh in FIGS. 5G and 5H, the current, which flows to the parasitic diode 102h in the upper arm before the time point t4 as the cathode current Idh, flows to the MOSFET 101h after the time point t4 as the drain current Ith.

On the other hand, in the present embodiment, as indicated by the thick solid line in the waveform diagram of Vgsh in FIG. 5E, the gate-source voltage Vgsh of the MOSFET 101h continues to be at a high level since before the time point t4. Therefore, as indicated by the thick solid line in the waveform diagram of Ith in FIG. 5G, the drain current Ith having a non-zero value continues to flow to the MOSFET 101h since before the time point t4. When the direction where the current flows to the coil of the motor 112 is changed, the voltage V2h of the decision circuit 103 in the upper arm falls to a low level. Thereafter, the operation since the time point t0 is repeated again. It should be noted that the dead time during the power running in the present embodiment occurs within a short period before and after the time point t1 as well as before and after the time point t3, and illustration thereof is omitted.

As described above, according to the power running in the present embodiment, the reflux current can flow to the MOSFETs 101h and 101k instead of the parasitic diodes 102h and 102k during the external control pause periods (t1 to t2, t3 to t4). As is apparent from FIGS. 5A to 5K, the dead time (the period during which both the MOSFETs 101h and 101k are in the OFF state) can be extremely shortened.

Since internal resistances of the MOSFETs 101h and 101k in the ON state are lower than those of the parasitic diodes 102h and 102k, a loss particularly during the external control pause periods (t1 to t2, t3 to t4) can be significantly reduced as compared with the comparative example. When SiC is applied as the semiconductor material of the MOSFETs 101h and 101k, as compared with a case where Si is applied, forward voltage drops of the parasitic diodes 102h and 102k are further increased, and therefore a loss reduction effect is also increased. Further, the conduction deterioration of the MOSFETs 101h and 101k can be reduced, and good conduction characteristics can be maintained for a long period of time.

<Operation During Regenerative Running>
(Operation During Regenerative Running in Comparative Example)

Next, an operation during the regenerative running will be described, but the operation of the comparative example will be described first, and then the operation of the present embodiment will be described.

FIGS. 6A to 6K show waveform diagrams of the voltages or the currents of respective components in the leg 130U during the regenerative running, and each waveform diagram in FIGS. 6A to 6K shows a voltage waveform or a current waveform at a position corresponding to that of each waveform diagram in FIGS. 5A to 5K. Also in FIGS. 6A to 6K, the thick solid line indicates a waveform according to the present embodiment, and the thick broken line indicates a waveform according to the comparative example. It is assumed that the polarities of the cathode currents Idh and Idk and the polarities of the drain currents Ith and Itk are also positive values in the downward direction as indicated by the arrows shown in FIG. 1.

Figure 6:
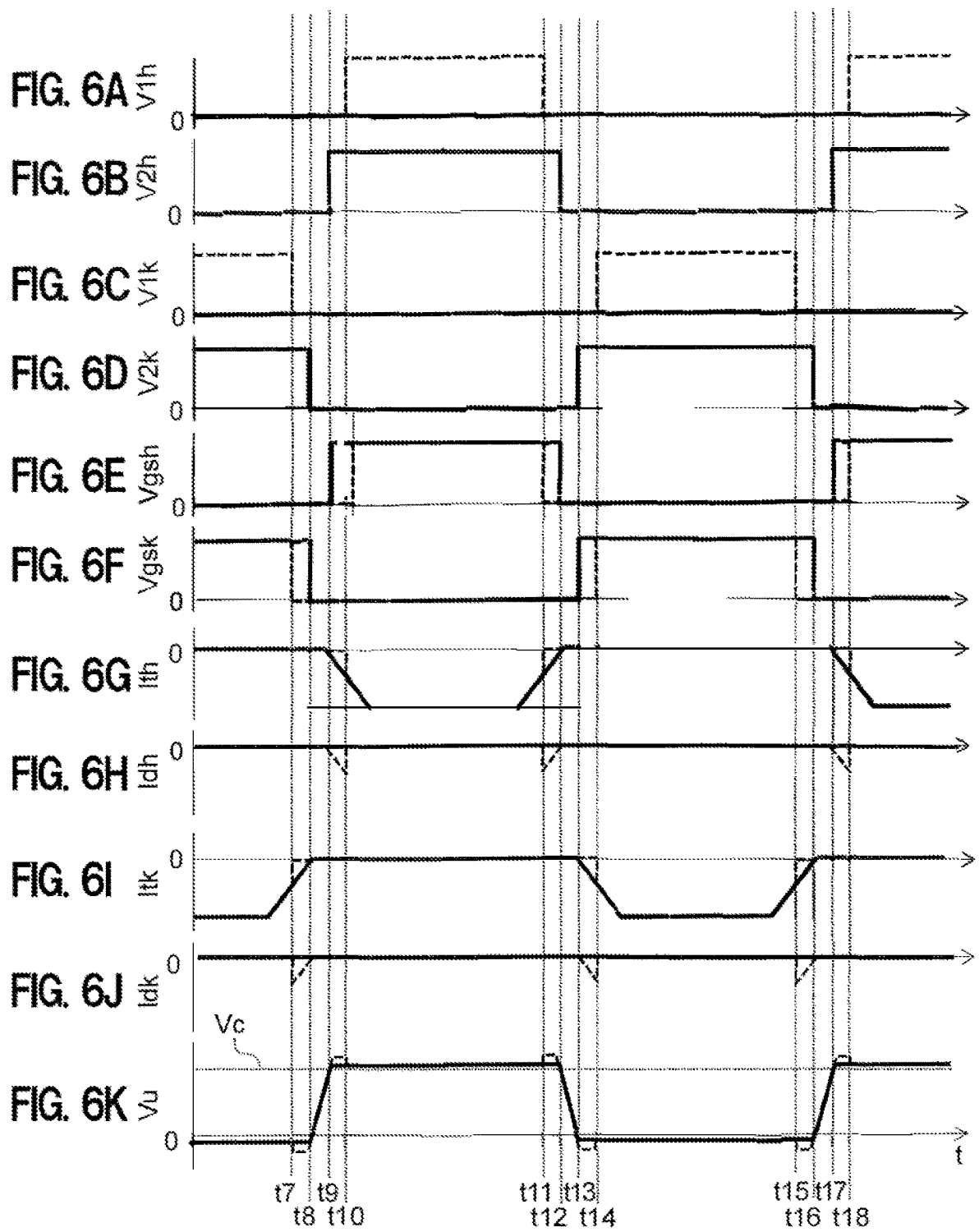
FIGS. 6A to 6K show waveform diagrams of the voltage V1$h$, the voltage V2$h$, the voltage V1$k$, the voltage V2$k$, the gate-source voltage Vgsh, the gate-source voltage Vgsk, the drain current Ith, the source current Idh, the drain current Itk, the cathode current Idk, and the U-phase voltage Vu, respectively, during regenerative running.

As indicated by thick broken lines in waveform diagrams of V1h and V1k in FIGS. 6A and 6C, the inverter control circuit 110 in the comparative example controls the voltages V1h and V1k also during the regenerative running.

That is, in the comparative example, the inverter control circuit 110 monitors the voltages Vu, Vv and Vw of the AC output terminals Nu, Nv and Nw. When the voltages in respective phases Vu, Vv and Vw are higher than the power supply voltage Vc by a certain voltage, or when a voltage (0 V) on a ground voltage Vn side of the DC input terminal Nn drops by a certain voltage, the control circuit sets the MOSFETs 101h and 101k in respective phases in the ON state to allow a rectified current to flow.

Therefore, in the comparative example, the upper arm compulsive conduction period and the lower arm compulsive conduction period are alternately repeated, similarly to those during the power running described in FIGS. 5A to 5K. The external control pause period in which the voltages V1h and V1k are both 0 V is provided between the above periods.

In the waveform diagram of V1h in FIG. 6A, a period from a time point t10 to a time point t11 and a period starting from a time point t18 are the upper arm compulsive conduction periods, and the inverter control circuit 110 keeps the voltage V1h at a high level in the same period. Further, in the waveform diagram of V1k in FIG. 6C, a period before a time point t7 and a period from a time point t14 to a time point t15 are the lower arm compulsive conduction periods, and the inverter control circuit 110 keeps the voltage V1k at a high level in the same period. A period from the time point t7 to the time point t10, a period from the time point t11 to the time point t14, and a period from the time point t15 to a time point t18 are the external control pause periods.

A period from the time point t7 to the time point t15 is referred to as "one cycle". Hereinafter, an operation during one cycle will be described.

The time point t7 is a timing when the flow of the rectified current to the MOSFET 101k in the lower arm is finished. In other words, as indicated by a thick broken line in a waveform diagram of Vgsk in FIG. 6F, the gate-source voltage Vgsk of the MOSFET 101k falls to a low level at the time point t7. Then, due to the counter electromotive force of the motor 112, the U-phase voltage Vu of the AC output terminal Nu starts to rise from the time point t8, and is higher than the power supply voltage Vc of the DC input terminal Np at the time point t9, as shown in a waveform diagram of Vu in FIG. 6K.

In the comparative example, the "external control pause period" is directly equal to the "dead time", and therefore a dead time continues until the time point t10. Therefore, even if the U-phase voltage Vu is higher than the power supply voltage Vc at the time point t9, as indicated by a thick broken line in a waveform diagram of Vgsh in FIG. 6E, the gate-source voltage Vgsh of the MOSFET 101h remains at a low level, and the MOSFET 101h remains in the OFF state. Therefore, as indicated by a thick broken line in a waveform diagram of Idh in FIG. 6H, the rectified current flows to the parasitic diode 102h in the upper arm as the cathode current Idh during a period from the time point t9 to the time point t10.

At the time point t10, when the dead time ends, as indicated by a thick broken line in the waveform diagram of V1h in FIG. 6A, the inverter control circuit 110 sets the voltage V1h of the upper arm to a high level during the upper arm compulsive conduction period (t10 to t11). Then, as indicated by the thick broken line in the waveform diagram of Vgsh in FIG. 6E, the gate-source voltage Vgsh of the MOSFET 101h in the upper arm rises to a high level at the time point t10, and the MOSFET 101h is in the ON state.

As a result, as indicated by thick broken lines in the waveform diagrams of Ith and Idh in FIGS. 6G and 6H, the rectified current, which flows to the parasitic diode 102h as the cathode current Idh, flows to the MOSFET 101h in the upper arm as the drain current Ith. As indicated by a thick broken line in the waveform diagram of Vu in FIG. 6K, the U-phase voltage Vu is higher than the power supply voltage Vc by an amount corresponding to the voltage drop of the parasitic diode 102h during the period from the time point t9 to the time point t10. When the MOSFET 101h is in the ON state at the time point t10, a difference between the U-phase voltage Vu and the power supply voltage Vc is reduced.

When the external control pause period (the dead time in the comparative example) starts again at the time point t11, as indicated by the thick broken line in the waveform diagram of V1h in FIG. 6A, the inverter control circuit 110 sets the voltage V1h in the upper arm to a low level. Accordingly, the output of the gate driver 105 is at a low level. As indicated by the thick broken line in the waveform diagram of Vgsh in FIG. 6E, the gate-source voltage Vgsh of the MOSFET 101h in the upper arm falls to a low level, and the MOSFET 101h is in the OFF state.

Accordingly, as indicated by thick broken lines in the waveform diagrams of Ith and Idh in FIG. 6H, the rectified current, which flows to the MOSFET 101h as the drain current Ith, flows to the parasitic diode 102h as the cathode current Idh. As a result, as indicated by the thick broken line in the waveform diagram of Vu in FIG. 6K, the U-phase voltage Vu is higher than the power supply voltage Vc by an amount corresponding to the voltage drop of the parasitic diode 102h during the period from the time point t11 to the time point t12.

Next, at the time point t12 in the waveform diagram of Vu in FIG. 6K, when the U-phase voltage Vu reaches the power supply voltage Vc, as indicated by the thick broken line in the waveform diagram of Idh in FIG. 6H, the cathode current Idh is a zero value. That is, the flow of the rectified current to the parasitic diode 102h is stopped, and the flow of the rectified current is finished in the upper arm.

Thereafter, a period from the time point t12 to the time point t16 is a period during which the rectified current flows to the lower arm. The operation during the period from the time point t12 to the time point t16 is the same as the above described operation during the period from the time point t8 to the time point t12, except that the operations of the upper and lower arms 130Uh and 130Uk are reversed. That is, from the time point t12 to the time point t16, the rectified current flows through the parasitic diode 102k in the lower arm during a period from time point t13 to time point t14. During this period, the U-phase voltage Vu is lower than the ground voltage Vn (=0 V) of the DC input terminal Nn by an amount corresponding to the voltage drop of the parasitic diode 102k. After the time point t16, the operation during a period from the time point t7 to the time point t16 is repeated.

(Operation During Regenerative Running of Present Embodiment)

Next, the operation of the present embodiment will be described.

As indicated by thick solid lines in the waveform diagrams of V1h and V1k in FIGS. 6A and 6C, during the regenerative running of the present embodiment, the inverter control circuit 110 stops level control over the voltages V1h and V1k, and the voltages V1h and V1k are maintained at a low level.

The operation after the time point t7 in FIGS. 6A to 6K will be described below. In the present embodiment, a state where the drain voltage Vdk (see FIG. 1) is lower than the source voltage Vsk continues in the MOSFET 101k in the lower arm since before the time point t7. Therefore, as shown in the waveform diagram of V2k in FIG. 6D, at the time point t7, the voltage V2k continues to be at a high level. As indicated by a thick solid line in the waveform diagram of Vgsk in FIG. 6F, the gate-source voltage Vgsk continues to be at a high level even at the time point t7, and the MOSFET 101k continues to be in the ON state. Accordingly, as indicated by a thick solid line in the waveform diagram of Itk in FIG. 6I, the rectified current continues to flow to the MOSFET 101k as the drain current Itk during a period from the time point t7 to the time point t8.

When the U-phase voltage Vu becomes the ground voltage Vn (=0 V) at the time point t8 in the waveform diagram of Vu in FIG. 6K, as indicated by a thick solid line in the waveform diagram of V2k in FIG. 6D, the voltage V2k output from the decision circuit 103 in the lower arm falls to a low level. Accordingly, as indicated by the thick solid line in the waveform diagram of Vgsk in FIG. 6F, the gate-source voltage Vgsk of the MOSFET 101k also falls to a low level at the time point t8, and the MOSFET 101k is in the OFF state. Accordingly, as indicated by the thick solid line in the waveform diagram of Itk in FIG. 6I, the drain current Itk becomes a zero value at the time point t8. That is, the flow of the rectified current to the MOSFET 101k is finished.

Thereafter, at the time point t9 in the waveform diagram of Vu in FIG. 6K, the U-phase voltage Vu of the AC output terminal Nu is higher than the power supply voltage Vc. Then, the drain voltage Vdh of the MOSFET 101h is lower than the source voltage Vsh. Accordingly, as shown in the waveform diagram of V2h in FIG. 6B, at the time point t9, an output signal of the decision circuit 103 in the upper arm, that is, the voltage V2h is at a high level. An output voltage of the gate driver 105 is also at a high level via the OR circuit 104 in the upper arm.

Accordingly, as indicated by a thick solid line in the waveform diagram of Vgsh in FIG. 6E, the gate-source voltage Vgsh of the MOSFET 101h in the upper arm rises to a high level at the time point t9, and the MOSFET 101h is in the ON state. Accordingly, the rectified current does not flow to the parasitic diode 102h in the upper arm, but flows to the MOSFET 101h as the drain current Ith as indicated by a thick solid line in the waveform diagram of Ith in FIG. 6G.

In the present embodiment, even at the time point t11, a state where the drain voltage Vdh is lower than the source voltage Vsh continues in the MOSFET 101h in the upper arm. Therefore, as shown in the waveform diagram of V2h in FIG. 6B, even at the time point t11, the voltage V2h continues to be at a high level. As indicated by the thick solid line in the waveform diagram of Vgsh in FIG. 6E, even at the time point t11, the gate-source voltage Vgsh continues to be at a high level, and the MOSFET 101h continues to be in the ON state. Accordingly, as indicated by the thick solid line in the waveform diagram of Ith in FIG. 6G, the rectified current continues to flow to the MOSFET 101h as the drain current Ith also during the period from the time point t11 to the time point t12.

At the time point t12 in the waveform diagram of Vu in FIG. 6K, when the U-phase voltage Vu becomes the power supply voltage Vc, the voltage V2h output from the decision circuit 103 in the upper arm falls to a low level as shown in the waveform diagram of V2h in FIG. 6B. Accordingly, as indicated by the thick solid line in the waveform diagram of Vgsh in FIG. 6E, the gate-source voltage Vgsh of the MOSFET 101h also falls to a low level at the time point t12, and the MOSFET 101h is in the OFF state. Accordingly, as indicated by the thick solid line in the waveform diagram of Ith in FIG. 6G, the drain current Ith becomes a zero value at the time point t12. That is, the flow of the rectified current to the MOSFET 101h is finished.

The U-phase voltage Vu is slightly higher than the power supply voltage Vc due to the voltage drop of the MOSFET 101h during a period from the time point t9 to the time point t12 when the rectified current flows to the MOSFET 101h. However, a difference between the U-phase voltage Vu and the power supply voltage Vc is smaller than that of the comparative example (thick broken line).

Thereafter, the operation during the period from the time point t12 to the time point t16 is the same as the above described operation during the period from the time point t8 to the time point t12, except that the operations of the upper and lower arms 130Uh and 130Uk are reversed. That is, during a period from the time point t13 to the time point t16, since the voltage V2k is at a high level as shown in the waveform diagram of V2k in FIG. 6D, as indicated by the thick solid line in the waveform diagram of Vgsk in FIG. 6F, the gate-source voltage Vgsk of the lower arm is also at a high level, and the MOSFET 101k is in the ON state during the same period. Accordingly, the rectified current continues to flow to the MOSFET 101k instead of the parasitic diode 102k in the lower arm.

Therefore, as indicated by a thick solid line in the waveform diagram of Vu in FIG. 6K, the U-phase voltage Vu is lower than the ground voltage Vn (=0 V) of the DC input terminal Nn by an amount corresponding to the voltage drop of the MOSFET 101k during the period from the time point t13 to the time point t16. A width of the voltage drop is smaller than that of the voltage drop of the comparative example indicated by the thick broken line. After the time point t16, the operation during a period from the time point t7 to the time point t16 is repeated.

As described above, according to the regenerative running in the present embodiment, even during the external control pause period (t7 to t10, t15 to t18) in the comparative example, that is, a period corresponding to the dead time, the MOSFETs 101h and 101k can be set in the ON state. In other words, the dead time (a period during which both the MOSFETs 101h and 101k are in the OFF state) in the present embodiment can be set to a very short period such as a period from the time point t8 to the time point t9, a period from the time point t12 to the time point t13, and a period from the time point t16 to the time point t17 in FIGS. 6A to 6K. In addition, since the cathode currents Idh and Idk hardly flow to the parasitic diodes 102h and 102k during these dead times, almost no power loss is generated.

During a period in which one of the MOSFETs 101h and 101k is in the ON state, the rectified current flows to the MOSFETs 101h and 101k instead of the parasitic diodes 102h and 102k. Accordingly, the loss generated in the MOSFETs 101h and 101k can be significantly reduced.

In particular, in the comparative example, when SiC is applied as the semiconductor material of the MOSFETs 101h and 101k, the forward voltage drops of the parasitic diodes 102h and 102k are increased as compared with the case where Si is applied. When the current flows to the parasitic diodes 102h and 102k, the conduction deterioration is generated in the MOSFETs 101h and 101k. According to the present embodiment, even when SiC is applied, the current can be prevented from flowing to the parasitic diodes 102h and 102k, and the conduction deterioration can also be prevented. Further, according to the present embodiment, since the synchronous rectification can be implemented only by the control of the autonomous control circuits 109h and 109k during the regenerative running, the inverter control circuit 110 can stop the level control over the voltages V1h and V1k. Accordingly, the configuration of the inverter control circuit 110 can be simplified, and the power consumption of the inverter control circuit 110 can also be reduced.

Effect of Embodiment

As described above, according to the present embodiment, since the control circuit (110) configured to output the control signal (V1h) which indicates whether to instruct the ON state of the switching element (101h), the decision circuit (103) configured to output the decision signal (V2h) which indicates the state of the switching element (101h) based on the voltage (Vdh−Vsh) between the main terminals of the switching element (101h), and the drive circuit (104, 105) configured to control the ON or OFF state of the switching element (101*h*) based on the control signal (V1*h*) and the decision signal (V2*h*) are provided, the dead time can be shortened.

Further, the decision signal (V2*h*) is a signal indicating whether to instruct the ON state of the switching element (101*h*). The drive circuit (104, 105) is configured to set the switching element (101*h*) in the ON state when at least one of the control signal (V1*h*) and the decision signal (V2*h*) instructs the ON state. Accordingly, the dead time can be shortened with a simple configuration.

According to the configuration in which the MOSFET is applied as the switching element (101*h*), the loss particularly in the parasitic diode (102*h*) can be reduced.

According to the configuration containing SiC as the semiconductor material of the switching element (101*h*), the conduction deterioration can be reduced, and the good conduction characteristics can be maintained for a long period of time.

Since a plurality of switching elements (101*h*) are provided and the decision circuit (103) is provided for each switching element (101*h*), individual control can be performed for each switching element (101*h*).

According to the present embodiment, the control circuit (110) has a function of stopping the level control over the control signal (V1*h*) when the switching element (101*h*) performs the rectification operation. Accordingly, the configuration of the control circuit (110) can be simplified and the power consumption of the control circuit (110) can also be reduced.

According to the present embodiment, the drive circuit (104, 105) includes the OR circuit (104) configured to input the control signal (high-level V1*h*) and the decision signal (high-level V2*h*) as the logical signals and output the logical sum of the control signal and the decision signal. Accordingly, the dead time can be shortened with a simple configuration. The drive circuit (104, 105) further includes the driver circuit (105) configured to drive the control terminal (gate terminal) of the switching element (101*h*) based on the output signal of the OR circuit (104). Accordingly, the control terminal (gate terminal) can be driven at an appropriate level.

According to the present embodiment, the driver circuit (105) drives the control terminal (gate terminal) such that the speed at which the switching element (101*h*) is switched from the ON state to the OFF state is faster than the speed at which the switching element (101*h*) is switched from the OFF state to the ON state. Accordingly, the chattering in the switching element (101*h*) can be prevented.

The decision circuit (103) is a comparator configured to compare the voltages (Vdh, Vsh) of the pair of main terminals (drain terminal, source terminal). Accordingly, the decision signal (V2*h*) can be output based on the comparison result.

In the decision circuit (103), a first level of the voltage between the main terminals (Vdh–Vsh) at which the decision signal (V2*h*) shifts from a state where no ON state of the switching element (101*h*) is instructed to a state where the ON state of the switching element (101*h*) is instructed, and a second level of the voltage between the main terminals (Vdh–Vsh) at which the decision signal (V2*h*) shifts from the state where the ON state of the switching element (101*h*) is instructed to the state where no ON state of the switching element (101*h*) is instructed are equal. Accordingly, the loss due to imparting the hysteresis characteristic can be prevented.

In the present embodiment, the voltage step-down circuit (106) is further included, which is configured to apply a voltage lower than the voltage between the main terminals (Vdh–Vsh) to the decision circuit (103). Accordingly, an inexpensive decision circuit (103) having a low withstand voltage can be applied.

[Modification]

The invention is not limited to the embodiment described above, and various modifications can be made. The embodiment described above is illustrated for easy understanding of the invention and is not necessarily limited to those including all the configurations described above. Another configuration may be added to the configuration of the above embodiment, and a part of the configuration may be replaced with another configuration. Control lines and information lines shown in the drawings are considered to be necessary for explanation, and all control lines and information lines necessary on the product are not necessarily shown. It may be considered that almost all the configurations are actually connected to each other. Possible modifications to the above-described embodiment are, for example, as follows.

(1) In the above embodiment, the individual autonomous control circuits 109*h* and 109*k* are provided for the respective MOSFETs 101*h* and 101*k*. However, a plurality of autonomous control circuits 109*h* and 109*k* may be integrated into one circuit block or one IC.

(2) Since the autonomous control circuit 109*h* in the upper arm is floating with respect to the ground voltage Vn in the above embodiment, the configuration thereof is partially different from the autonomous control circuit 109*k* in the lower arm. Specifically, the autonomous control circuit 109*h* in the upper arm includes the level shift circuit 107 and is provided with the direct current power source 108*h* corresponding to the floating. However, the autonomous control circuit 109*k* in the lower arm may be the same as the autonomous control circuit 109*h* in the upper arm. In particular, when a large fluctuation is generated in the ground voltage Vn, the configuration of the autonomous control circuit 109*k* is preferably the same as that of the autonomous control circuit 109*h*.

(3) In order to prevent chattering, the gate driver 105 (see FIG. 3) according to the above embodiment uses the PMOS 16 having the channel width smaller than the NMOS 24, thereby making the rise times of the gate voltages Vgh and Vgk of the MOSFETs 101*h* and 101*k* longer than the fall times of the gate voltages Vgh and Vgk. However, the method for preventing the chattering is not limited thereto.

Figure 7:
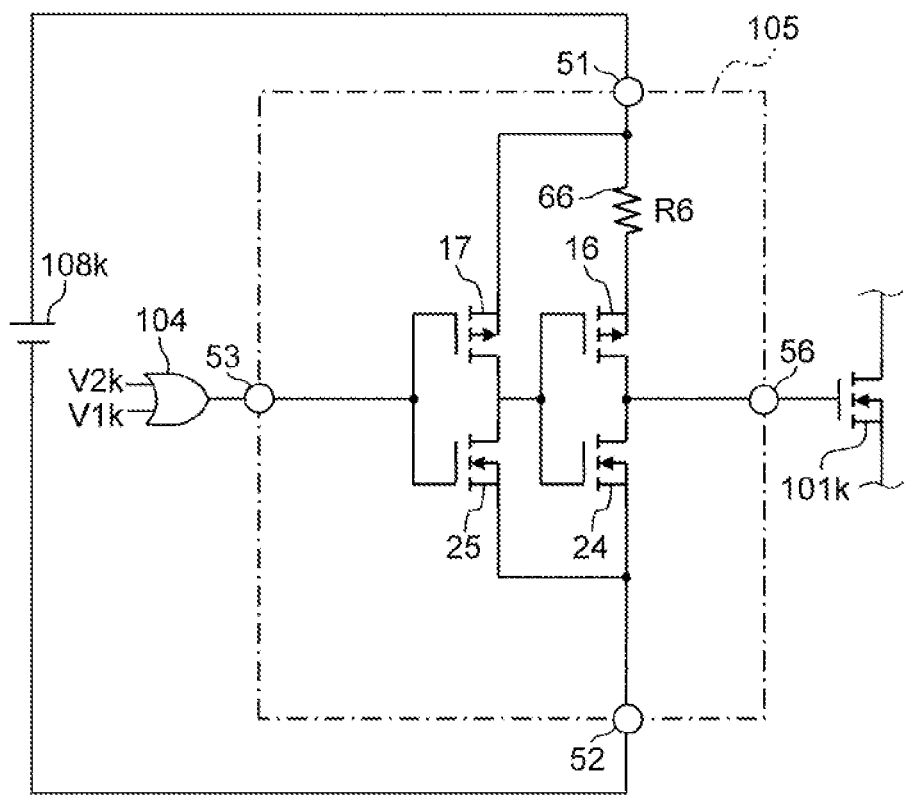
FIG. 7 is a circuit diagram of a modification of the gate driver.

FIG. 7 is a circuit diagram of the gate driver 105 that prevents the chattering by another method. In the gate driver 105 shown in FIG. 7, a resistor 66 having a predetermined resistance value R6 is inserted between the power supply terminal 51 and the PMOS 16. Other configurations are the same as those of the gate driver 105 (see FIG. 3) of the above embodiment. In the present modification, rise times of the gate voltages Vgh and Vgk can be made longer than fall times by the resistor 66. Accordingly, the PMOS 16 having the same channel width as that of the NMOS 24 can be applied, and a manufacturing process and the like can be simplified.

(4) In the above embodiment, the voltage step-down/shutoff circuit 106 is provided in the autonomous control circuits 109*h* and 109*k*. However, when a withstand voltage of the non-inversion input terminal 34 of the decision circuit 103 is sufficient, the voltage step-down/shutoff circuit 106 may be omitted. That is, the drain terminals and the source terminals of the MOSFETs 101*h* and 101*k* may be directly connected to the non-inversion input terminal 34 and the inversion input terminal 33 of the decision circuit 103. In addition, in a case where the voltage step-down/shutoff circuit 106 is provided, when a drain-source withstand voltage of the NMOS 27 (see FIG. 4) is sufficient, the resistor 61 can be omitted. Further, when a gate-drain withstand voltage of the NMOS 26 is sufficient, the resistors 62 and 63 can be omitted.

(5) The inverter device 140 of the above embodiment may be applied not only to the electric motor device 150 that drives the motor 112, but also to various electric devices.

REFERENCE SIGN LIST

101*h*, 101*k* MOSFET (switching element)
102*h*, 102*k* parasitic diode
103 decision circuit
104 OR circuit (drive circuit)
105 gate driver (drive circuit, driver circuit)
106 voltage step-down/shutoff circuit (voltage step-down circuit)
110 inverter control circuit (control circuit)
112 motor (load device)
113 direct current power source
140 inverter device
150 electric motor device
V1*h*, V1*k* voltage (control signal)
V1*h*, V2*h* voltage (decision signal)

The invention claimed is:

1. An inverter device comprising:
 a switching element including a control terminal and a pair of main terminals;
 a control circuit configured to output a control signal which indicates whether to instruct an ON state of the switching element;
 a decision circuit configured to output a decision signal which indicates a state of the switching element based on a voltage between the main terminals of the switching element; and
 a drive circuit configured to control the ON state and an OFF state of the switching element based on the control signal and the decision signal;
 wherein the drive circuit includes an OR circuit configured to input the control signal and the decision signal as logical signals and output a logical sum of the control signal and the decision signal.

2. The inverter device according to claim 1, wherein the decision signal is a signal indicating whether to instruct the ON state of the switching element, and the drive circuit is configured to set the switching element into the ON state when at least one of the control signal and the decision signal instructs the ON state.

3. The inverter device according to claim 2, wherein the switching element contains SiC as a semiconductor material.

4. The inverter device according to claim 2, wherein in the decision circuit, a first level of the voltage between the main terminals at which the decision signal shifts from a state where no ON state of the switching element is instructed to a state where the ON state of the switching element is instructed, and a second level of the voltage between the main terminals at which the decision signal shifts from the state where the ON state of the switching element is instructed to the state where no ON state of the switching element is instructed are equal.

5. The inverter device according to claim 1, wherein the switching element is a MOSFET.

6. The inverter device according to claim 1, wherein a plurality of switching elements are provided, and the decision circuit is provided for each of the switching element.

7. The inverter device according to claim 1, wherein the switching element is provided between a direct current power source and a load device and is configured to perform a rectification operation when electric power is regenerated from the load device to the direct current power source, and
 the control circuit has a function of stopping level control over the control signal when the switching element performs the rectification operation.

8. The inverter device according to claim 1, wherein the drive circuit further includes a driver circuit configured to drive the control terminal of the switching element based on an output signal of the OR circuit.

9. The inverter device according to claim 8, wherein the driver circuit is configured to drive the control terminal such that a speed at which the switching element is switched from the ON state to the OFF state is faster than a speed at which the switching element is switched from the OFF state to the ON state.

10. The inverter device according to claim 1, wherein the decision circuit is a comparator configured to compare voltages of the pair of main terminals.

11. The inverter device according to claim 1, further comprising:
 a voltage step-down circuit inserted between one of the main terminals of the switching element and the decision circuit and configured to apply a voltage lower than the voltage between the main terminals to the decision circuit.

12. An electric motor device comprising:
 an inverter device; and
 a motor driven by the inverter device, wherein the inverter device includes:
  a switching element including a control terminal and a pair of main terminals;
  a control circuit configured to output a control signal which indicates whether to instruct an ON state of the switching element;
  a decision circuit configured to output a decision signal which indicates a state of the switching element based on a voltage between the main terminals of the switching element; and
  a drive circuit configured to control the ON state and an OFF state of the switching element based on the control signal and the decision signal;
 wherein the drive circuit includes an OR circuit configured to input the control signal and the decision signal as logical signals and output a logical sum of the control signal and the decision signal.

13. An inverter device comprising:
 a switching element including a control terminal and a pair of main terminals;
 a control circuit configured to output a control signal which indicates whether to instruct an ON state of the switching element;
 a decision circuit configured to output a decision signal which indicates a state of the switching element based on a voltage between the main terminals of the switching element; and
a drive circuit configured to control the ON state and an OFF state of the switching element based on the control signal and the decision signal; wherein
 the switching element is provided between a direct current power source and a load device and is configured to perform a rectification operation when electric power is regenerated from the load device to the direct current power source, and the control circuit has a function of stopping level control over the control signal when the switching element performs the rectification operation.

14. An inverter device comprising:

a switching element including a control terminal and a pair of main terminals;

a control circuit configured to output a control signal which indicates whether to instruct an ON state of the switching element;

a decision circuit configured to output a decision signal which indicates a state of the switching element based on a voltage between the main terminals of the switching element;

a drive circuit configured to control the ON state and an OFF state of the switching element based on the control signal and the decision signal; and a voltage step-down circuit inserted between one of the main terminals of the switching element and the decision circuit and configured to apply a voltage lower than the voltage between the main terminals to the decision circuit.

* * * * *